US012794662B2

(12) United States Patent
Gruber et al.

(10) Patent No.: US 12,794,662 B2
(45) Date of Patent: Nov. 10, 2026

(54) MULTI-DEVICE SYSTEM AND METHOD FOR PHASE ALIGNMENT OF DEVICES IN THE MULTI-DEVICE SYSTEM

(71) Applicant: Intel Corporation, Santa Clara, CA (US)

(72) Inventors: Daniel Gruber, St. Andrae (AT); Edwin Thaller, Faak am See (AT); Michael Kalcher, Villach (AT)

(73) Assignee: Intel Products IP LLC, Santa Clara, CA (US)

(*) Notice: Subject to any disclaimer, the term of this patent is extended or adjusted under 35 U.S.C. 154(b) by 0 days.

(21) Appl. No.: 18/145,024

(22) Filed: Dec. 22, 2022

(65) Prior Publication Data

US 2024/0214177 A1 Jun. 27, 2024

(51) Int. Cl.

| | |
|---|---|
| ***H04L 7/033*** | (2006.01) |
| ***G06F 1/10*** | (2006.01) |
| ***G06F 1/12*** | (2006.01) |
| ***H03L 7/081*** | (2006.01) |

(52) U.S. Cl.

CPC .............. *H04L 7/0337* (2013.01); *G06F 1/10* (2013.01); *G06F 1/12* (2013.01); *H03L 7/0812* (2013.01)

(58) Field of Classification Search

CPC . H04L 7/0337; G06F 1/10; G06F 1/12; H03L 7/0812

USPC ......................... 375/219–222, 267, 354, 375

See application file for complete search history.

(56) References Cited

U.S. PATENT DOCUMENTS 10,763,865 B1 * 9/2020 Badizadegan .......... H03L 7/089
11,469,765 B1 * 10/2022 Brady ....................... G06F 1/12
12,445,117 B2 * 10/2025 Srinivasan Gopalan .................... H03K 5/01
12,556,192 B2 * 2/2026 Kundu ................ H03M 1/1014
2004/0041947 A1 * 3/2004 Williams .................. H03L 7/16 375/E7.278
2008/0298476 A1 * 12/2008 Bereza ................... H03K 5/133 375/257
2011/0204908 A1 * 8/2011 Tada .............. G01R 31/318552 324/750.3
2012/0076176 A1 * 3/2012 Gelhausen ................ H03L 7/18 375/E1.002
2012/0195400 A1 * 8/2012 Tomar ..................... H04L 7/044 375/354
2017/0063383 A1 * 3/2017 Yang ....................... H03L 7/099
2019/0103956 A1 * 4/2019 Meninger ............. H04L 1/0065
2021/0044472 A1 * 2/2021 Dorosenco .............. H03L 7/104

(Continued)

*Primary Examiner* — Emmanuel Bayard

(74) *Attorney, Agent, or Firm* — 2SPL Patent Attorneys PartG mbB; Yong Beom Hwang

(57) ABSTRACT

A multi-device system and a method for phase alignment of multiple devices in a multi-device system. The system includes a plurality of devices, a plurality of clock dividers, and a delay circuit. The plurality of devices are configured to operate based on a first clock signal. The clock dividers are configured to generate a second clock signal from the first clock signal and provide the second clock signal to the devices. The delay circuit is configured to incur a specific delay to the second clock signal provided to the devices such that a phase of the second clock signal provided to the devices is spread over time. Each of the clock dividers may be reset based on a reference clock signal provided to each clock divider, and the delay circuit may incur the specific delay on the reference clock signal provided to each clock divider.

24 Claims, 14 Drawing Sheets

(56) References Cited

U.S. PATENT DOCUMENTS

| | | | | |
|---|---|---|---|---|
| 2022/0365173 | A1* | 11/2022 | Moehlmann | G01S 7/4017 |
| 2023/0136353 | A1* | 5/2023 | J | H03L 7/16<br>327/156 |
| 2023/0198536 | A1* | 6/2023 | Molina | H03M 1/1033<br>341/120 |

* cited by examiner

MULTI-DEVICE SYSTEM AND METHOD FOR PHASE ALIGNMENT OF DEVICES IN THE MULTI-DEVICE SYSTEM

BACKGROUND

In a multi-transceiver (TRX) system including multiple transmitters and receivers, all individual transmitters and receivers should exhibit a deterministic phase and data delay at start-up to avoid complicated phase measurement and calibration schemes. While the high-frequency radio frequency (RF) clock signal is distributed to the transmitters and receivers in a deterministic manner, any derived clocks (e.g., by clock division) have random phases at every start-up.

Conventional methods for providing phase determinism in multi-TRX systems include phase measurement and calibration directly on the clock, delay measurement of the data and calibration, and using low frequency synchronization clock. In conventional schemes, the random clock phases are measured with additional circuitry to capture their alignments to some reference clock. The effective data delay through the converter relative to a reference phase is measured, e.g., from the converter input to its output.

The conventional methods have drawbacks. Additional circuitry is needed to capture the random clock phases. Since the phase accuracy needed is usually better than half the RF clock period, high precision circuitry is needed. In addition to the area and power overhead, the measurement needs to be performed at each start-up of any of the frequency dividers within the respective receiver or transmitter, extending start-up times, etc. After measurement of the phases, the phase needs to be calibrated, either by directly modifying the clock phases of the dividers, or by correctly delaying the data streams at the converter interfaces.

Similarly, a significant amount of high precision circuitry is needed to either capture the transmitter output or precisely generate the receiver input to measure their delays, increasing both area and power. These measurements need to be repeated at each start-up of any of the dividers in the converters, which extends the start-up times. With this scheme, the clock phases need to be calibrated, either by directly modifying the clock phases or by delaying the data streams at the converter interfaces.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
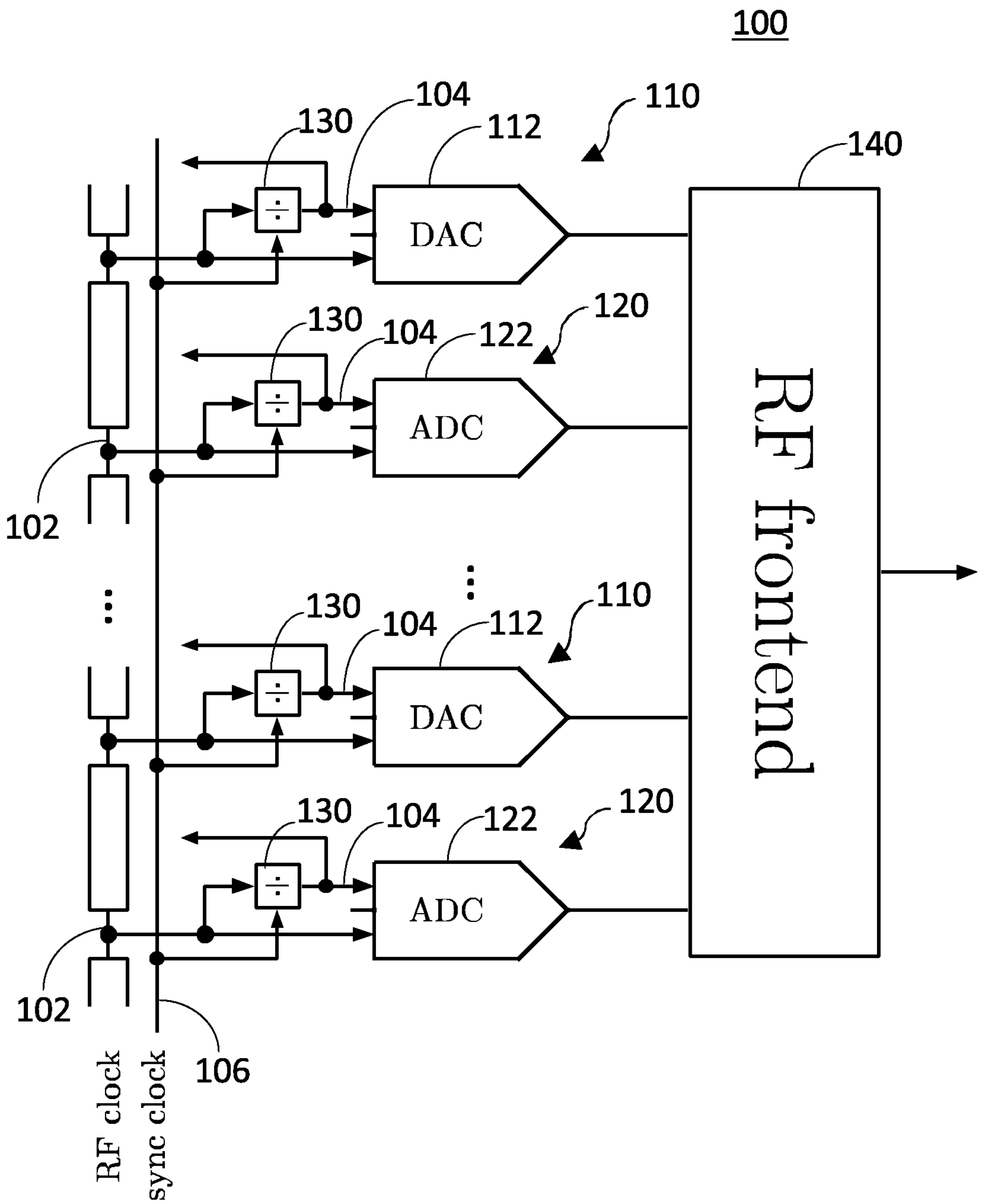
FIG. 1 shows an example multi-transceiver system.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

In examples, a low-frequency synchronization clock is used to render the clock phases of the devices (e.g., transceivers, etc.) in a multi-device system deterministic. In examples, instead of synchronizing all devices/circuits in a multi-device system to the same synchronization clock phase, the phase of each device can be programmatically and deterministically altered, e.g., along the grid of the RF clock. While maintaining deterministic clock phases, the low frequency current consumption of the individual devices (e.g., transceivers, etc.) can be spread out and the superposition of other spurious tones can potentially be improved by different programmable delays.

The examples disclosed herein allow the optimization of spurious performance of the individual devices (e.g., transceivers) in a multi-device system (e.g., a multi-transceiver system) by skewing the individual devices/circuits in time while maintaining phase determinism. The examples can be implemented with very little overhead, barely increasing silicon area and power consumption, and low circuit complexity.

Hereafter, examples will be explained with reference to a multi-transceiver system including a plurality of transceivers that need synchronization in processing. The examples can be extended to any multi-device system including multiple devices that need synchronization among the devices. Hereafter, the terms "synchronization clock signal" and "reference clock signal" will be used interchangeably.

FIG. 1 shows an example multi-transceiver system 100. The multi-transceiver system 100 includes a plurality of transmitters 110 and/or a plurality of receivers 120. Each transmitter 110 includes a digital-to-analog converter (DAC) 112, and each receiver 120 includes an analog-to-digital converter (ADC) 122. An RF clock signal 102 is distributed to the transmitters 110 and the receivers 120 and the transmitters 110 and the receivers 120 may operate on the RF clock signal 102. The transmitters 110 and the receivers 120 are coupled to the RF front-end 140 for transmission and reception of a signal.

In a multi-transceiver system, deterministic and coherent (clock) phases are needed, for example for modern wireless communications, such as multiple-input multiple-output (MIMO), etc. Modern high performance transceiver systems operate with high frequencies, e.g., an RF clock with rates exceeding 10 GHZ.

In addition to the RF clock signal 102, lower frequency clock signals 104 (referred to as TRX clock signals as well) are also needed in the transmitters 110 and the receivers 120 for more efficient signal processing and arithmetic operations. For example, a digital front-end (DFE) (not shown in FIG. 1) generally runs at lower frequencies for more efficient operation. Therefore, the low frequency data needs to be converted and/or serialized to the RF clock rate, or vice versa.

The lower frequency clock signals 104 (TRX clock signals) may be derived from the supplied RF clock signal 102 by a frequency divider 130 (a clock divider). A frequency divider (also called a clock divider) is a device that receives an input signal of a frequency $f_{in}$ and generates and output signal of frequency $f_{out}$, where $f_{out}=f_{in}/n$. The frequency dividers 130 derive a lower frequency clock signal(s) 104 from the RF clock signal 102 and supply the lower frequency clock signal(s) 104 to the transmitters 110 and the receivers 120.

Frequency dividers 130 have a drawback of not being phase coherent. Each time the frequency dividers 130 start, the phase of the low frequency clock signal 104 of the frequency dividers 130 is random. For a single transceiver/converter, this random behavior poses no issue. However, in a multi-transceiver system, the random phases of the frequency divider output complicate synchronization of the DACs and ADCs. Random startup might even prohibit disabling the frequency divider circuits after a training or calibration routine in order to keep constant phase alignment.

Synchronization schemes for a multi-transceiver system usually make use of an additional low frequency synchronization clock signal 106. The synchronization clock signal 106 may act as a reference for the entire multi-transceiver system 100. In the example in FIG. 1, this synchronization clock signal 106 is distributed alongside the RF clock signal 102. In general, any form of distributing this clock, which ensures sufficient signal quality, is possible to achieve phase determinism. The synchronization clock signal 106 may be used to reset the frequency dividers 130 simultaneously, thus synchronizing the frequency dividers 130.

Figure 2A:
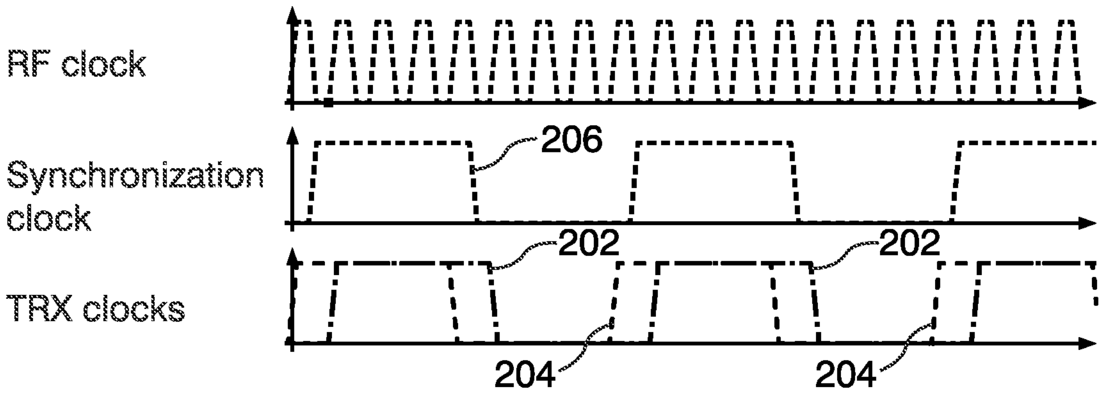
FIGS. 2A and 2B show example TRX clock signals generated by the frequency dividers for two transceivers.
Figure 2B:
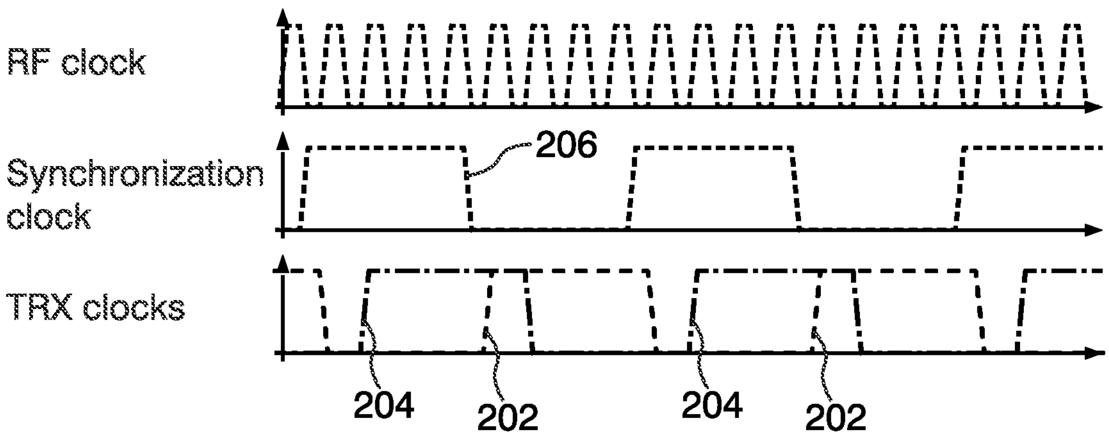

FIGS. 2A and 2B show example TRX clock signals 202, 204 generated by the frequency dividers for two transceivers. In this example, the frequency dividers are not synchronized and start up without deterministic phases. As the frequency dividers start up completely randomly, no phase determinism is achieved between the TRX clock signals 202, 204, and the phases of the TRX signals 202, 204 are not synchronous to the reference clock signal (the synchronization clock signal 206).

Figure 3:
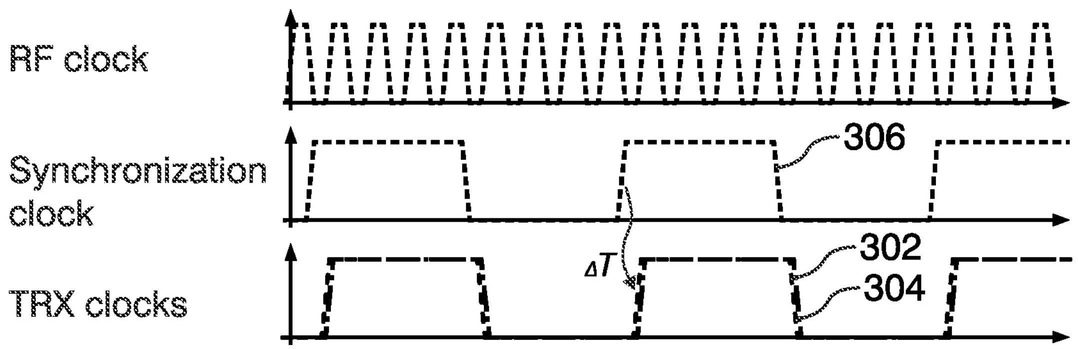
FIG. 3 shows example TRX clock signals generated by the frequency dividers for two transceivers synchronized to the reference clock signal.

FIG. 3 shows example TRX clock signals 302, 304 generated by the frequency dividers for two transceivers synchronized to the reference clock signal (the synchronization clock signal 306). In this example, the frequency dividers for the transceivers are synchronized with the reference clock signal 306 and start up with synchronized clock phases. All TRX clock signals 302, 304 (overlapped in time in FIG. 3) exhibit a fixed time delay 47 to the reference clock signal 306. Phase determinism is achieved apart from the run time of the clocks to the individual transceivers/converters, which usually is in a pico-second range and does not change.

Figure 4:
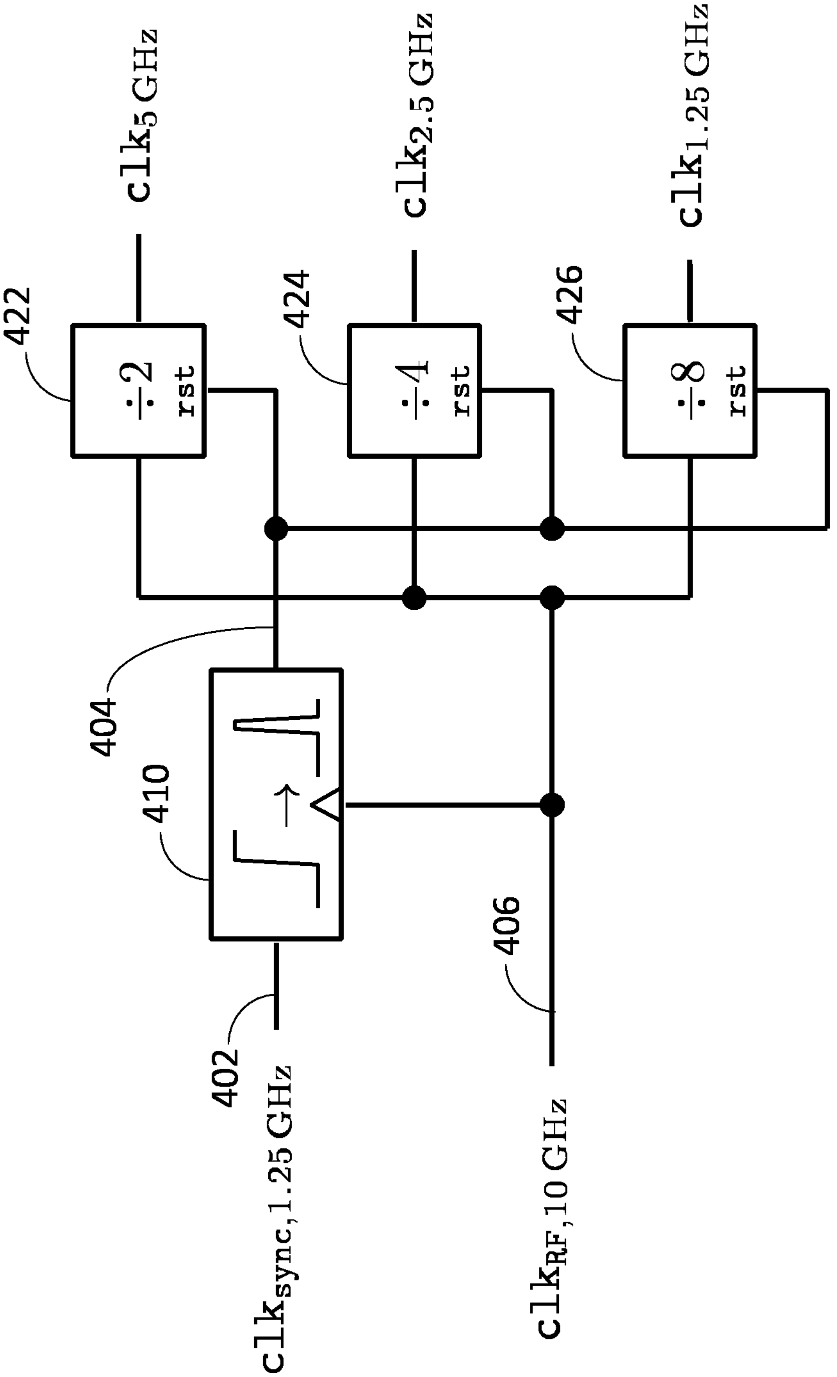
FIG. 4 shows an example circuit implementation for synchronized frequency dividers.

FIG. 4 shows an example circuit implementation for synchronized frequency dividers. An edge detector 410 is used generate a reset pulse 404 from the reference clock signal 402 (i.e., a synchronization signal) for synchronizing the individual frequency dividers 422, 424, 426. The edge detector 410 generates a short pulse (a reset pulse 404) when a defined edge (either a rising edge, a falling edge, or both depending on the configuration) is detected on the reference clock signal 402. The reset pulse 404 generated by the edge detector 410 is distributed to the frequency dividers 422, 424, 426 to reset the frequency dividers 422, 424, 426. The frequency dividers 422, 424, 426 are synchronized as being reset simultaneously with the reset pulse 404.

In the example shown in FIG. 4, three divided clock signals (at 5 GHZ, 2.5 GHZ, and 1.25 GHz in this example) are generated by the frequency dividers 422, 424, 426 from the RF clock signal 406 (e.g., a 10 GHz input RF clock). The frequency divided outputs may be generated with dedicated dividers as shown in FIG. 4, or, alternatively by a divider chain. For example, a chain of two or three divide-by-2 frequency dividers may be used instead of a single divide-by-4 or divide-by-8 divider, and each frequency divider may be reset with the reset pulse 404 generated by the edge detector 410 from the reference clock signal 402. The reference clock's frequency (1.25 GHZ in this example) may be a fraction of the lowest output clock frequency, (e.g., 625 MHZ, 312.5 MHZ, etc. in the example). It should be noted that the numeric description herein is merely an example, not a limitation, and the frequencies may be different.

Figure 5:
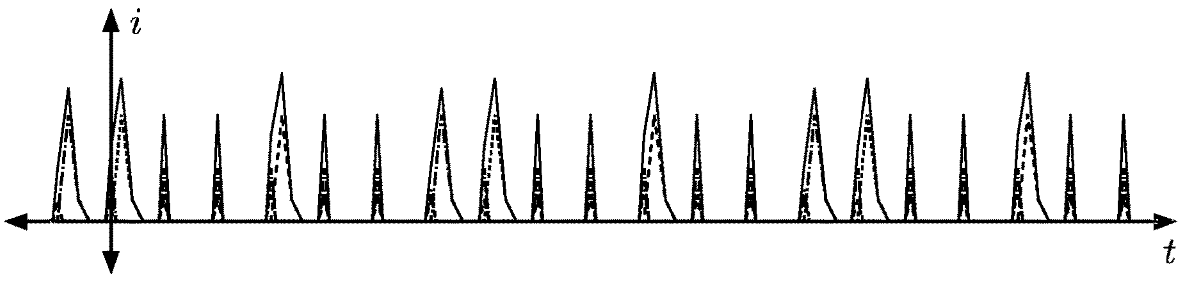
FIG. 5 shows current consumption of three transceivers in a multi-transceiver system without synchronization.

With random phases of the frequency dividers in case the synchronization scheme is not implemented, the low frequency current consumption of the devices (e.g., transceivers) may be randomly distributed. FIG. 5 shows current consumption of three transceivers in a multi-transceiver system without synchronization. As shown in FIG. 5, the current profile of the three transceivers shows arbitrary superposition of the supply currents of the three transceivers, spread out over time, resulting in a rather smooth current profile, or concentrated in few spikes.

Figure 6:
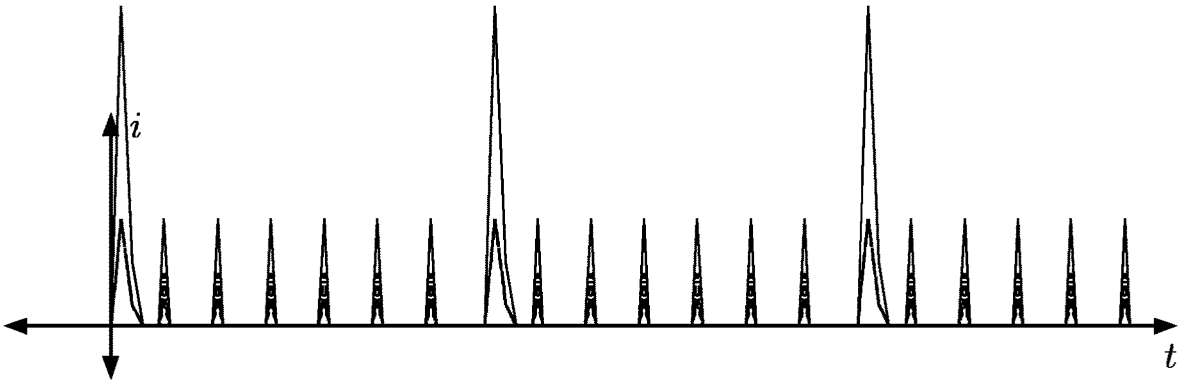
FIG. 6 shows current profile of three transceivers in a multi-transceiver system with conventional synchronization as shown in FIG. 4.

FIG. 6 shows current profile of three transceivers in a multi-transceiver system with conventional synchronization as shown in FIG. 4. In FIG. 6, the clocks for the transceivers are synchronized using a conventional scheme to achieve phase coherence. In this case, as shown in FIG. 6, the current consumption is concentrated in a very small portion of the clock period, resulting in very pronounced spikes at the low frequency rate. This can potentially degrade the performance of the transceiver system and its individual channels due to coupling mechanisms via the power supply.

Furthermore, with a fixed phase of the low frequency portions of the circuits, other spurious influences and coupling mechanisms, e.g., clocks from the DFE via the substrate, are deterministically excited. For example, spurious tones of multiple sources may interfere by superposition. Whether they add constructively or cancel destructively is determined by the alignment of the spurs' phases, which may be determined by physical placement and distances of the circuit blocks.

Examples for deterministic and programmable phase alignment of multiple devices in a multi-device system are explained hereafter. To overcome the afore-mentioned issues, in examples, the synchronization scheme is extended such that the TRX clock signals for the individual devices (e.g., transmitters/receivers) in the multi-device system are spread out in time in a deterministic manner.

A multi-device system includes a plurality of devices (e.g., transmitters/receivers, etc.), a plurality of clock dividers, and delay circuit. The plurality of devices are configured to operate based on a first clock signal (e.g., an RF clock signal) and a second clock signal (e.g., a TRX clock signal) supplied to the plurality of devices. The plurality of clock dividers may be configured to generate the second clock signal from the first clock signal and provide the second clock signal to the plurality of devices. The delay circuit may be configured to incur a specific delay to the second clock signal provided to each or a subset of the plurality of devices such that a phase of the second clock signal provided to each or a subset of the plurality of devices is spread over time.

In examples, each of the plurality of clock dividers may be configured to be reset based on a reference clock signal provided to each clock divider, and the delay circuit may be configured to incur the specific delay on the reference clock signal provided to each clock divider. In some examples, the phase of the second clock signal provided to each or a subset of the plurality of devices may be spread evenly over time. In some examples, the phase of the second clock signal provided to a pair of adjacent devices may be inverted. In some examples, the delay circuit may be configured to incur the specific delay on an output signal of each clock divider. The specific delay may depend on the configuration of the plurality of devices. The specific delay may be set differently depending on how the devices are configured/used. For example, if only a subset of devices (e.g., 4 out of 8 devices) are active, or if a device is configured to operate in a low power mode, the specific delay may be set differently.

Figure 7:
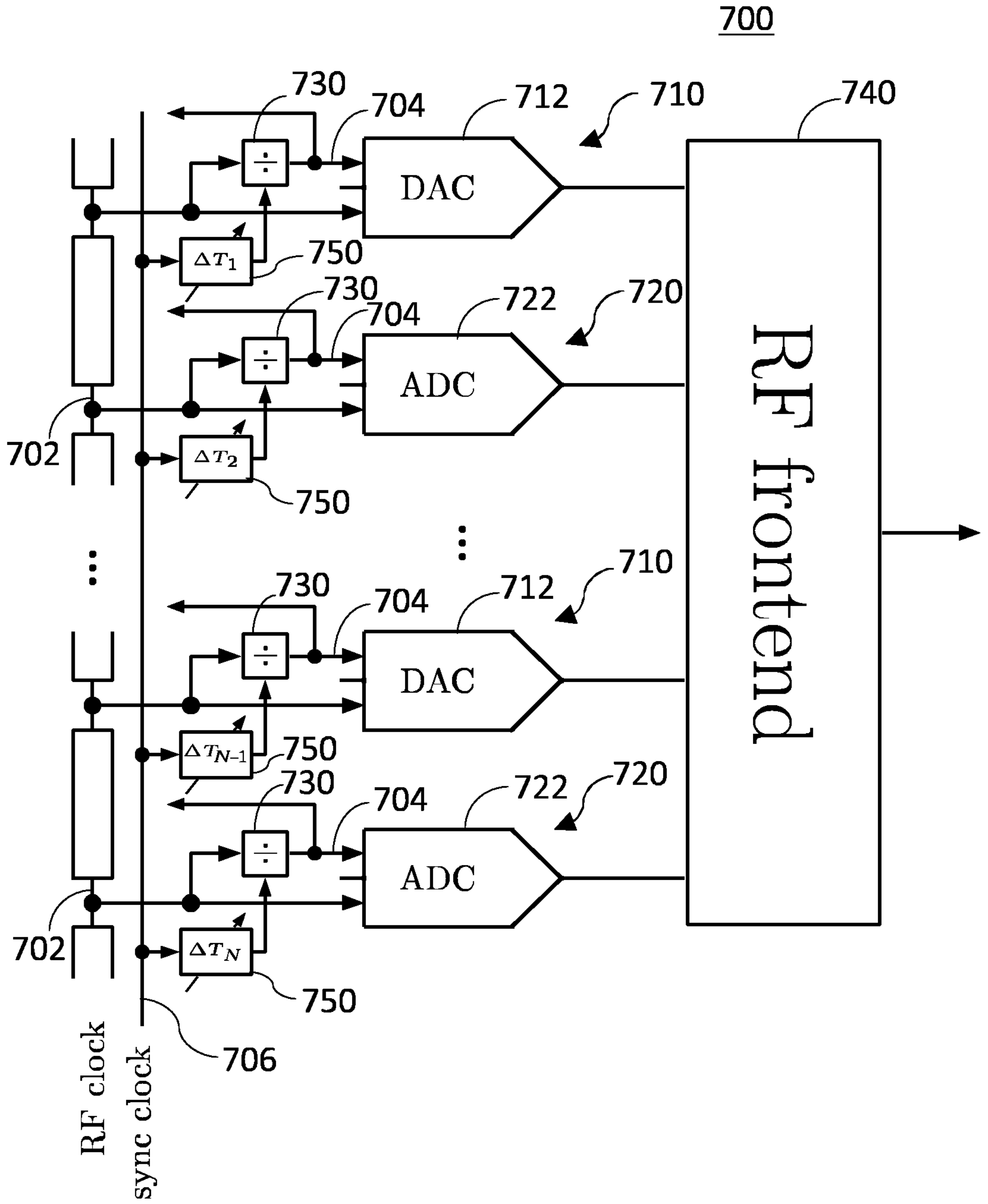
FIG. 7 shows an example multi-transceiver system with clock synchronization scheme disclosed herein.

FIG. 7 shows an example multi-transceiver system with clock synchronization scheme disclosed herein. The multi-transceiver system 700 includes a plurality of transmitters 710 and a plurality of receivers 720. Each transmitter 710 includes a DAC 712, and each receiver 720 includes an ADC 722. An RF clock signal 702 is distributed to the transmitters 710 and the receivers 720. In addition to the RF clock signal, a TRX clock signal 704 (a lower frequency clock signal) is also supplied to the transmitters 710 and the receivers 720. The multi-transceiver system 700 includes frequency dividers 730 for generating the TRX clock signals 704 for the transmitters 710 and the receivers 720. The frequency dividers 730 may generate the lower-frequency TRX clock signals 704 based on the RF clock signal 702. The frequency dividers 730 are reset based on the synchronization clock signal 706. The multi-transceiver system 700 may include delay units 750 for phase alignment of the TRX clock signals 704 (i.e., the devices) in a deterministic way such that the phases of the TRX clock signals 704 for the plurality of transceivers are spread over time. The delay $\Delta T_i$ of the TRX clock signals to each transceiver i may be either fixed or programmable, which allows for further optimization on the device.

The alignment of the TRX clock signals 704 with deterministic delays can be achieved in several ways. In one example, each TRX clock signal 704 may be aligned with the synchronization clock signal 706 with a specific delay by delaying the synchronization clock signal 706 supplied to each frequency divider 730 as shown in FIG. 7. The delay units 750 delay the synchronization clock signal 706 that is used to reset each of the frequency dividers 730. The delay value for each frequency divider 730 is set such that the phases of the TRX clock signals 704 generated by the frequency dividers 730 are spread over time.

Alternatively, the TRX clock signals 704 may be aligned with the synchronization clock signal 706 with deterministic delays by delaying the output clock signals of the synchronized frequency dividers 730. In this example, the output signals of the frequency dividers 730 are delayed in a deterministic way such that the phases of the TRX clock signals 704 supplied to the transceivers are spread over time.

Figure 8:
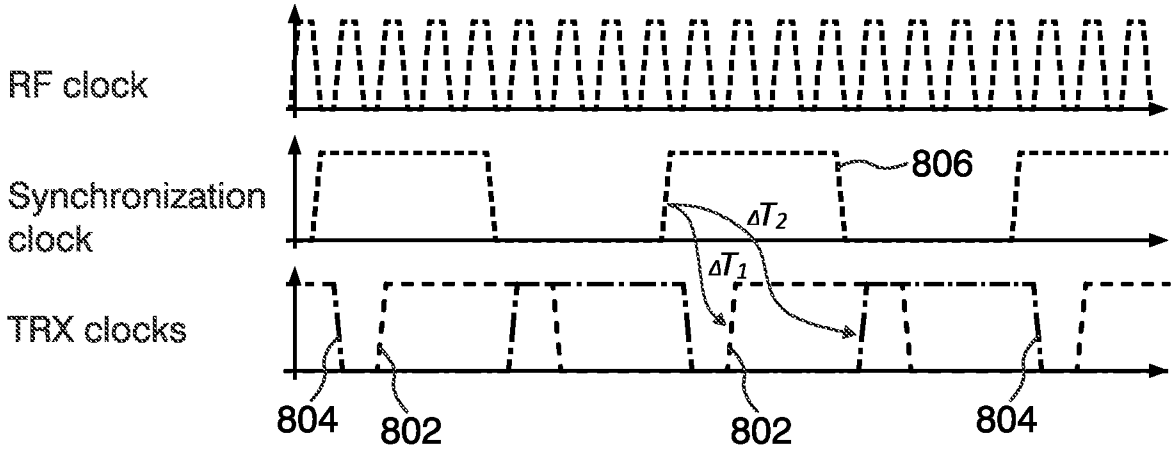
FIG. 8 shows an example of TRX clock signals generated for two transceivers with synchronized clock phases and deterministic delays $\Delta T_i$ for each transceiver.

FIG. 8 shows an example of TRX clock signals 802, 804 generated for two transceivers with synchronized clock phases and deterministic delays $\Delta T_i$ for each transceiver. As shown in FIG. 8, the TRX clock signals 802, 804 are not phase aligned directly to the synchronization clock signal 806, but with deterministic delays, denoted $\Delta T_1$ and $\Delta T_2$. The first transceiver clock signal 802 is phase aligned with the synchronization clock signal 806 with a delay $\Delta T_1$, and the second transceiver clock signal 804 is phase aligned with the synchronization click signal 806 with a delay $\Delta T_2$.

The phase of the TRX clock signals 704 to the transmitters 710 and the receivers 720 are spread over time. However, since the delay of each TRX clock signal 704 with respect to the synchronization clock signal 706 is either fixed or known based on the chosen programming of the corresponding delay unit 750, the delay can directly be accounted for by the DFE, e.g., by shifting the converters data streams accordingly.

One of the main benefits of this approach is to temporally spread out the low frequency current consumption of the transceivers/converters in a deterministic (and programmable) way. Thus, an overall system current profile mimicking a random one as shown in FIG. 5, which does not exhibit large spikes and spurs, can be chosen to improve the transceivers/converters performance.

In addition, the phases of some sources of spurious tones, e.g., the digital clocks via the substrate or supplies, can be influenced by the clock phase of the converters, having them cancel in the ideal case by proper phase alignment. Thus, spurious performance of the converters can potentially be improved by modifying the delays. This optimization can be performed in a deterministic fashion and is not dependent on the random start-up phases of the individual dividers.

In some examples, this synchronization scheme may be applied to only a (critical) subset of the devices (transceivers/converters) in a system. The synchronization scheme may be applied if there are multiple RF or synchronization clocks present. If multiple thereof are used in the same device (transceiver/converter), the delay(s) may be programmed to keep the required phase alignments.

Example implementations of the delay element are explained hereafter. The individual delays $\Delta T_i$ in FIG. 7 may be implemented in various ways, e.g., using the CMOS gate delay of a buffer/delay chain, RC delay, current starved inverters, amongst others, either fixed or programmable. In some examples, the reference clock may be delayed by a multiple of the RF clock period. For high RF clock frequencies, as used in high performance TRX systems, a sufficient granularity can be achieved.

Figure 9:
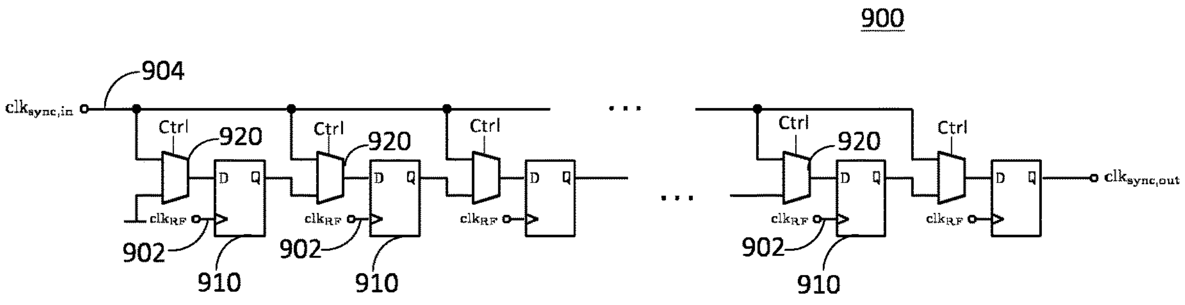
FIG. 9 shows an example (programmable) delay unit.

FIG. 9 shows an example (programmable) delay unit 900. The (programmable) delay unit 900 includes a chain of a plurality of shift register-multiplexer pairs 910-920 coupled in series. The shift registers 910 (e.g., D flipflops) may be clocked by the RF clock signal 902. The synchronization clock signal 904 (a reference clock signal) is supplied to a first input of each multiplexer 920. The output of the multiplexer 920 is input into the shift register 910 in each pair with the RF clock 902. The output of the shift register 910 is input into the second input of the subsequent multiplexer 920 in the chain. The second input of the first multiplexer in the chain is grounded. Each multiplexer 920 outputs one of the inputs to the subsequent shift register 910 based on the control input to each multiplexer 920. One of the shift registers 910 in the chain selected by the control word samples the synchronization clock signal 904 via the multiplexer 920, and the remainder of the chain is a programmable length shift register, running at RF frequency. The delay is determined by the number of active registers, which is determined by the control word. The structure shown in FIG. 9 may be used for a fixed delay. For a fixed delay, a specific number of shift registers 910 are used depending on the fixed delay value, and the multiplexers in FIG. 9 are replaced by wires accordingly. The programmable delay element in this example includes only digital cells and registers, resulting in a simple circuit structure, consuming little power and area.

Figure 10:
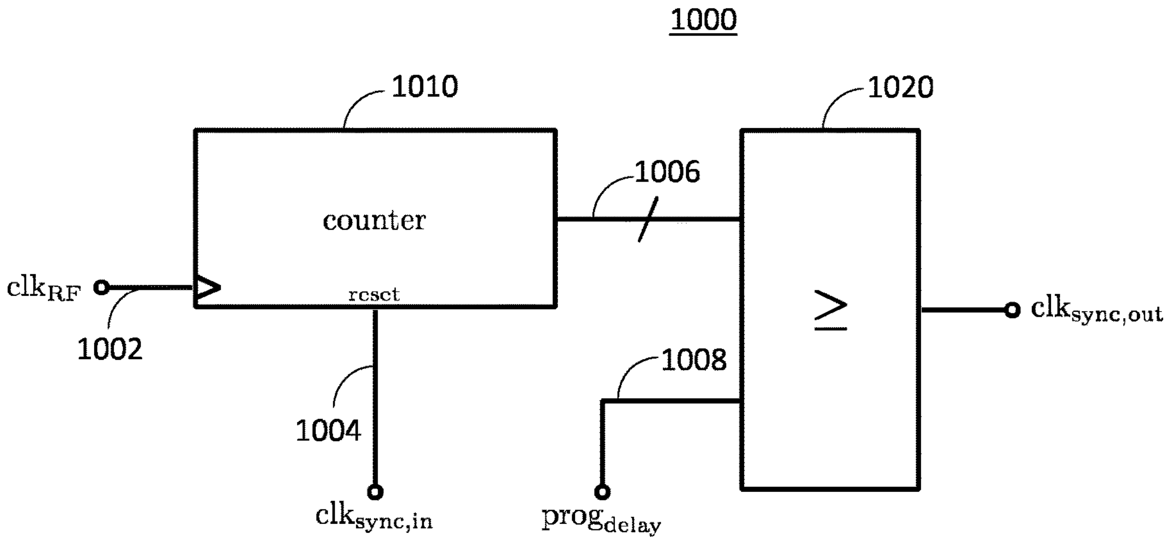
FIG. 10 shows another example (programmable) delay unit.

FIG. 10 shows another example (programmable) delay unit 1000. The delay unit 1000 is a counter-based programmable delay unit. The delay unit 1000 includes a counter 1010 and a comparator 1020. The counter 1010 is reset by the synchronization clock signal 1004 while the counter 1010 is incremented by the RF clock signal 1002. The comparator 1020 compares the counter value 1006 with a (programmable) threshold 1008. When the counter value 1006 exceeds the (programmable) threshold 1008, the delayed synchronization clock signal is output and passed to the frequency dividers. This type of delay element can be beneficial in terms of silicon area and power, when the ratio of the RF and synchronization clock frequencies is very large.

Different delay settings may influence the overall (low frequency) current profile of a multi-transceiver system. For example, different delay settings may influence the spectral performance of the individual converters (DACs and ADCs). This behavior is shown in FIGS. 5 and 6.

Examples for delay settings for reduced supply disturbances are explained hereafter with reference to the multi-transceiver system in FIG. 7. The converters (DACs and ADCs) are numbered from 1 to N. Without loss of generality, the delays may be multiples of the RF clock period $T_{RF}=1/f_{RF}$. As an example, with N=8, the ratio of the RF frequency and synchronization clock frequency is $$\frac{f_{RF}}{f_{sync}} = 8.$$

Figure 11:
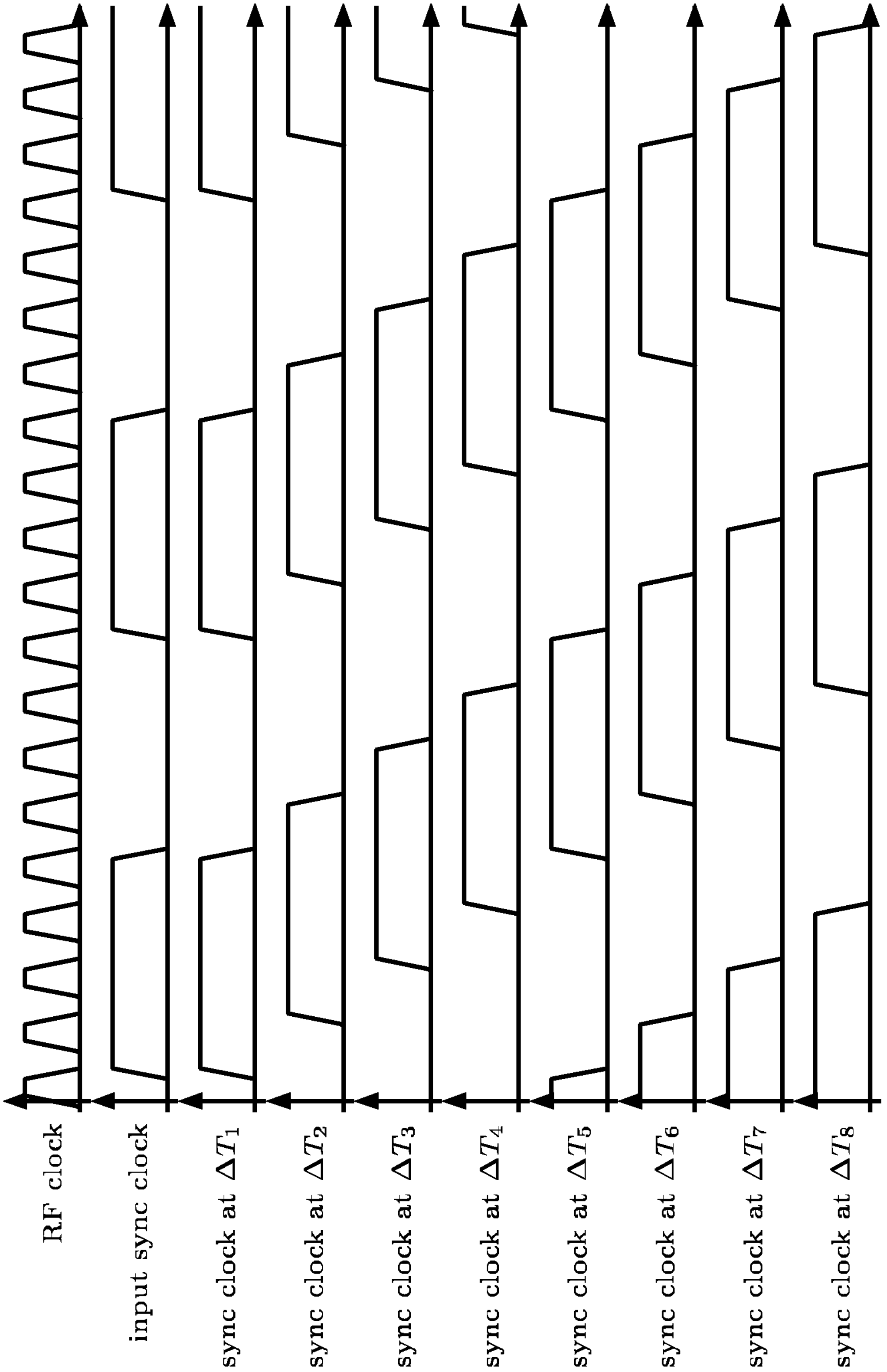
FIG. 11 shows the delay settings in accordance with this example for an equal distribution of the low frequency current profile over time.

In one example, the delays may be set to spread out the low frequency current profile equally in time. For example, the delay of the i-th converter may be set as follows:

$$\Delta T_i = ((i-1+0)\bmod N)\cdot T_{RF}, \qquad \text{Equation (1)}$$

where $\Delta T_i$ is the delay of the i-th converter. $T_{RF}$ is the RF clock period, and o accounts for an arbitrary (integer) offset. FIG. 11 shows the delay settings in accordance with this example for an equal distribution of the low frequency current profile over time. The delay setting in FIG. 11 linearly distributes the low frequency current consumption. In Equation (1), o accounts for an arbitrary offset that delays all converters with respect to the synchronization clock but keeps their relative phase relation to each other.

In another example, the clock phases of a pair of adjacent converters may be inverted each other. For example, the delay of the i-th converter may be set as follows:

$$\Delta T_i = \left(\left\{\begin{array}{ll} i-1+o, & i \text{ odd} \\ N/2+i-1+o, & i \text{ even} \end{array} \bmod N\right.\right)\cdot T_{RF}. \qquad \text{Equation (2)}$$

Figure 12:
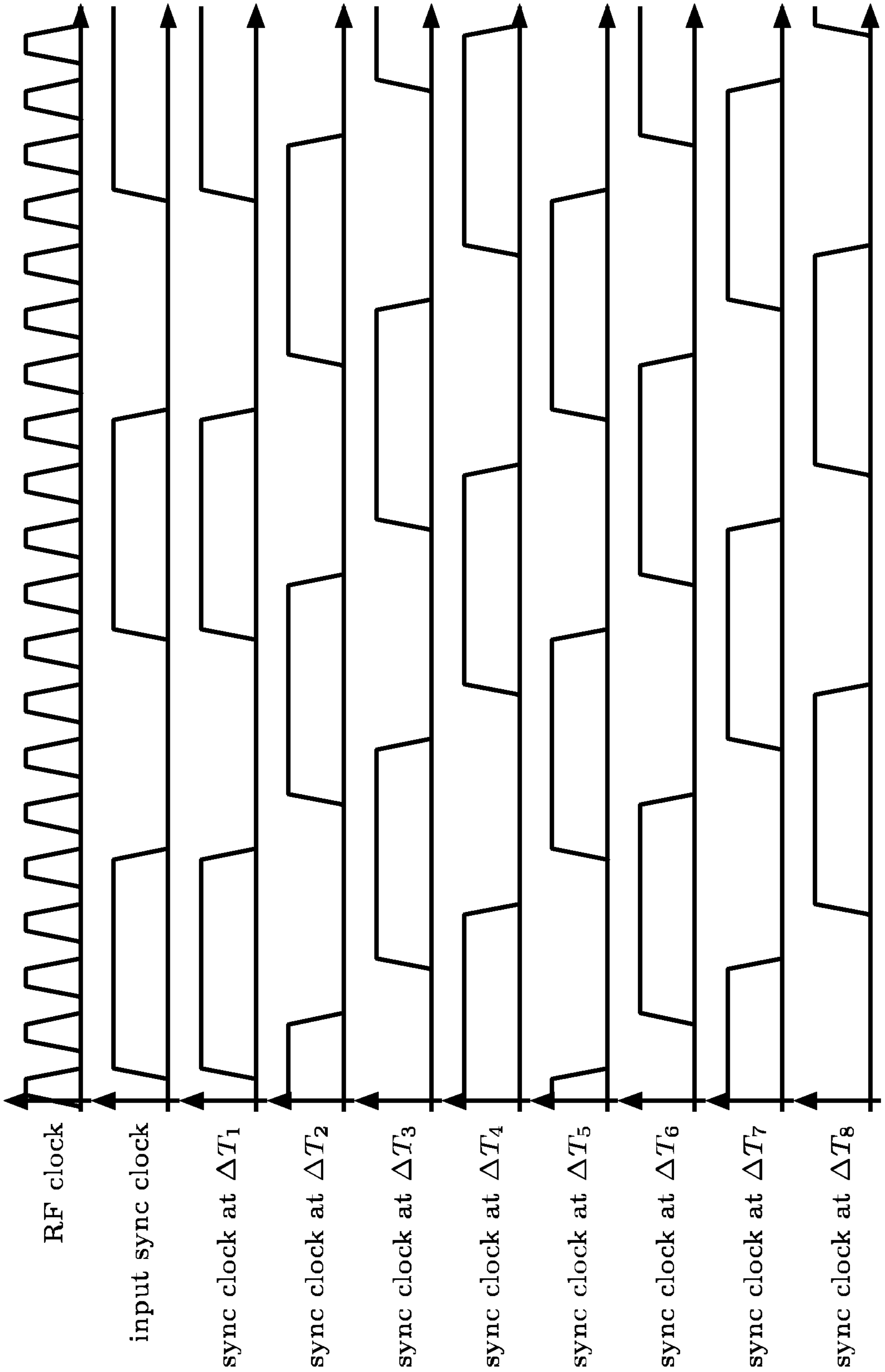
FIG. 12 shows delay settings in accordance with this example for an equal distribution of the low frequency current profile over time.

FIG. 12 shows delay settings in accordance with this example for an equal distribution of the low frequency current profile over time. In this example, the phase of the synchronization clock for every other converter is nearly inverted.

The delay settings may be chosen in different ways depending on the actual multi-transceiver system. Considerations for the delay setting may include the number of simultaneously active converters, frequency ratios of the RF and low frequency clocks, whether there are multiple power supply domains, distances to other susceptible or aggressor circuitry and other known coupling mechanisms, etc.

Figure 13:
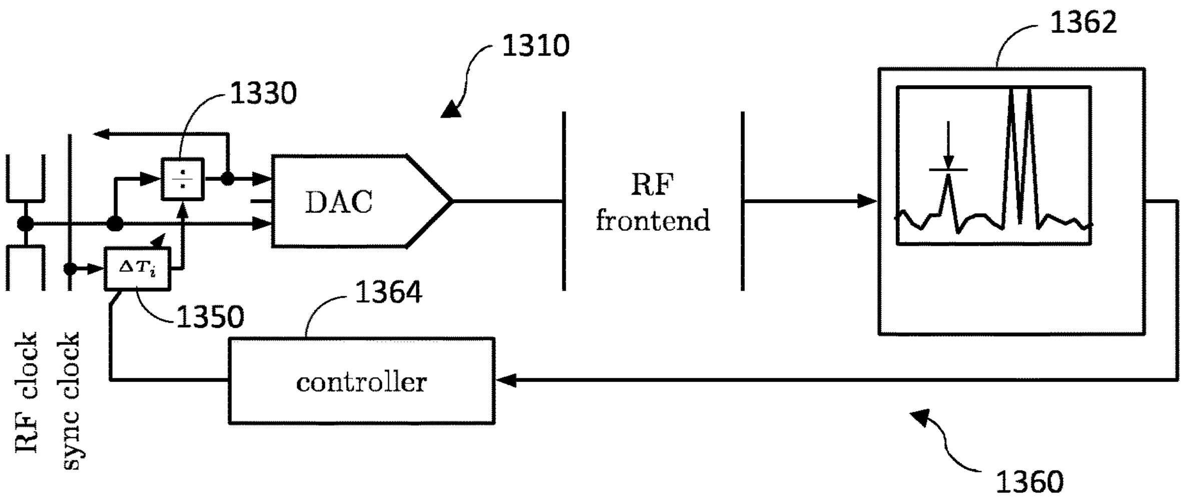
FIG. 13 shows an example that a calibration loop is used to find suitable delays for transmitters in a multi-transceiver system.

In some examples, a calibration loop may be used to find suitable values (and/or settings) for the individual delay elements. FIG. 13 shows an example that a calibration loop 1360 is used to find suitable delays $\Delta T_i$ for transmitters 1310 in a multi-transceiver system. FIG. 13 shows only one transmitter 1310 for simplicity. In this example, a calibration loop 1360 including a spectrum analyzer 1362 and a controller 1364 is used. The spectrum analyzer 1362 is used to measure the spectrum of the output signal of the transmitter 1310, and the controller 1364 may set the delay value of the delay unit 1350 for the transmitter 1310 based on the spectrum analysis. The calibration using the calibration loop 1360 and its measurement may be performed either during device characterization with special equipment in a laboratory, during manufacturing on automatic test equipment, or within foreground or background calibration procedures on the device itself.

While the transmitter 1310 is operating, its output is captured and the spurious and/or undesired emissions are captured, e.g., by the spectrum analyzer 1362 or the like. Either the full spectrum or only a portion of the spectrum containing some tones of interest may be captured and analyzed. By changing the delay $\Delta T_i$ and re-synchronizing the frequency divider 1330 to the new delay, the spurious emission of interest may be influenced, and evaluated by the controller 1364. The controller 1364 tries to optimize the spurious emissions by varying the delay, e.g., by an exhaustive search, random search, gradient descent, or any other suitable optimization algorithm.

It should be noted that the structure of the calibration loop 1360 shown in FIG. 13 is merely an example and may be configured differently. For example, the spectrum analyzer 1362 may be replaced by a feedback receiver on the device, and the controller 1364 may be external equipment or internal logic of the device. The specific delay values may be stored as calibration data and applied (e.g., at startup of the device) or dynamically remeasured.

Figure 14:
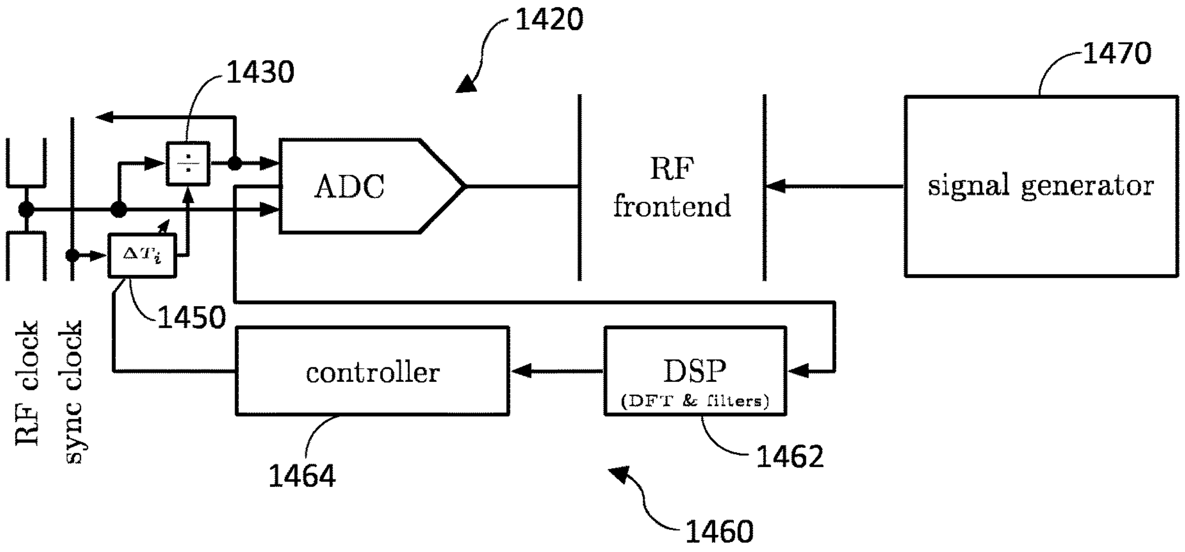
FIG. 14 shows an example calibration loop to find suitable delays for receivers.

FIG. 14 shows an example calibration loop to find suitable delays $\Delta T_i$ for receivers. FIG. 14 shows only one receiver 1420 for simplicity. In the example shown in FIG. 14, a calibration loop 1460 including a processor 1462 (e.g., a DSP, or the like) and a controller 1464 is used. The processor 1462 receives data (i.e., the ADC output) and processes the received data. The controller 1464 sets the delay value of the delay unit 1450 for the receiver 1420 based on the received data.

While the receiver 1420 is operating, (e.g., with a signal generator 1470 attached), the receiver's output is captured and the spurious and/or undesired and/or other frequencies of interest are detected, e.g., by means of signal processing by the processor 1462. Either the full spectrum or only a portion of it containing some tones of interest may be captured and analyzed. By changing the delay $\Delta T_i$ and re-synchronizing the frequency divider 1430 to the new delay, the spurious tones of interest may be influenced and evaluated by the controller 1464. The controller 1464 tries to optimize these spurious tones by varying the delay, e.g., by an exhaustive search, random search, gradient descent, or any other suitable optimization algorithm.

The calibration loop 1460 and its measurement can be performed either during device characterization with special equipment in a laboratory, during manufacturing on automatic test equipment, or within foreground or background calibration procedures on the device itself. The structure shown in FIG. 14 is only exemplary. For example, the signal generator 1470 may be replaced by a transmitter or a dedicated calibration DAC on the device, and the controller 1464 may be external equipment or internal logic of the device. The specific delay values may be stored as calibration data and applied (e.g., at startup of the device) or dynamically remeasured.

The delay settings in accordance with the examples disclosed herein may be used as a starting point for the calibration mechanism to just further optimize the spectral performance. In some examples, if the coupling effects between transceivers/converters are static, with the calibration of a single transceiver/converter, all other delays may be kept fixed, relative to the calibrated transceiver/converter. In other words, an initial optimization of all transceiver/converters' delays may be performed during manufacturing calibration or at startup, while adjustment of the delay setting (e.g., tracking of temperature effects) may be done only by calibrating a single transceiver/converter and maintaining the relations of other delays.

Figure 15:
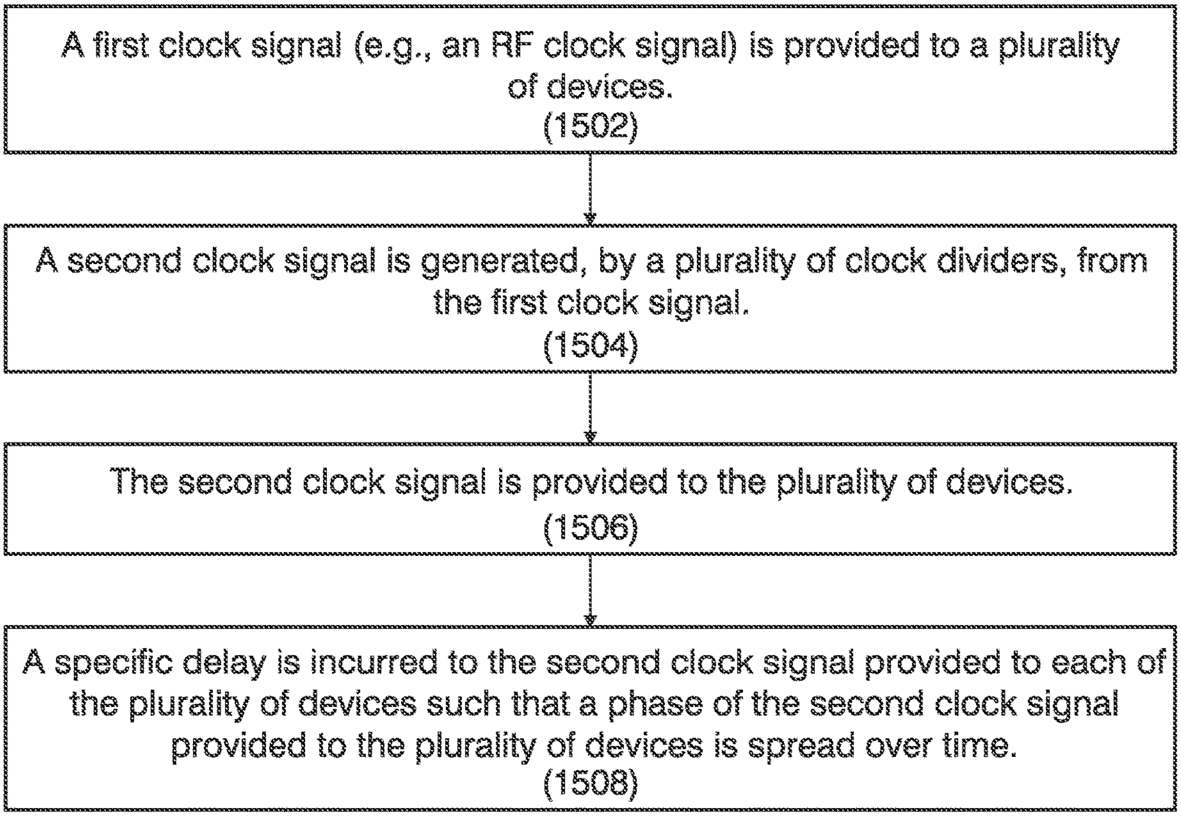
FIG. 15 is a flow diagram of a method for phase alignment of multiple devices in a multi-device system.

FIG. 15 is a flow diagram of a method for phase alignment of multiple devices in a multi-device system. A first clock signal (e.g., an RF clock signal) is provided to a plurality of devices (e.g., transceivers, etc.) (1502). A second clock signal is generated, by a plurality of clock dividers, from the first clock signal (1504). The second clock signal is provided to the plurality of devices (1506). A specific delay is incurred to the second clock signal provided to each of the plurality of devices such that a phase of the second clock signal provided to the plurality of devices is spread over time (1508).

The method may further include providing a reference clock signal to the plurality of clock dividers. The clock dividers are reset based on the reference clock signal such that the specific delay is applied to the reference clock signal provided to each clock divider. The specific delay may be a multiple of a period of the first clock signal. The phase of the second clock signal provided to the plurality of devices may be spread evenly over time. Alternatively, the specific delay may be incurred on an output signal of each clock divider. The specific delay may be adaptively changed.

The examples provide a method for phase coherence in a multiple TRX system, synchronizing all individual transceivers/converters to a reference clock with a known and programmable delay. This additional programmability is advantageous for smoothing out current spikes of multiple transceivers on the supplies, lowering potential disturbances and spurious tones. Furthermore, the temporal alignment between the individual transceivers/converters can be optimized to reduce or even cancel spurious tones of multiple sources that depend on their phase alignment. The examples may be implemented by a full digital implementation with low silicon area, low power consumption, and low circuit complexity.

Figure 16:
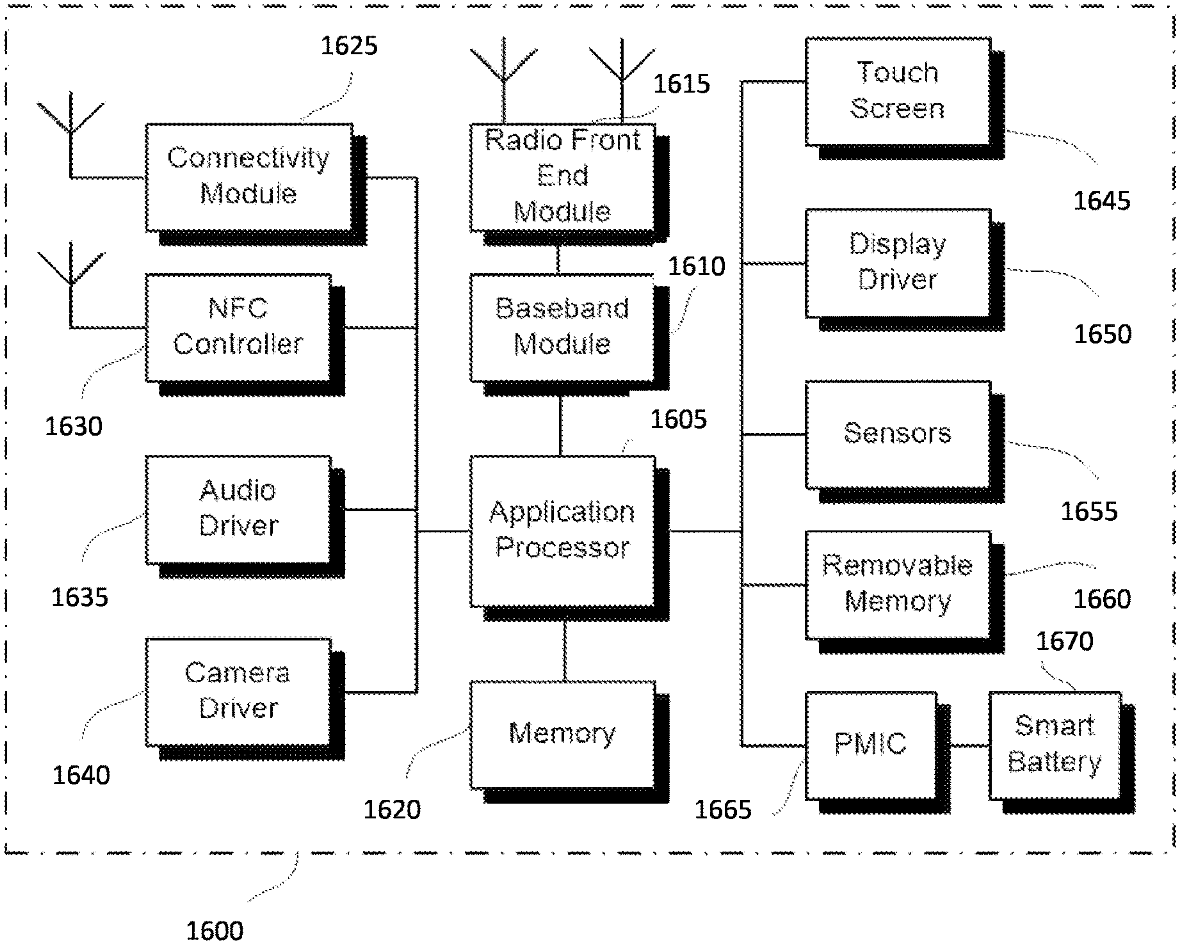
FIG. 16 illustrates a user device in which the examples disclosed herein may be implemented.

FIG. 16 illustrates a user device 1600 in which the examples disclosed herein may be implemented. For example, the examples disclosed herein may be implemented in the radio front-end module 1615, in the baseband module 1610, etc. The user device 1600 may be a mobile device in some aspects and includes an application processor 1605, baseband processor 1610 (also referred to as a baseband module), radio front end module (RFEM) 1615, memory 1620, connectivity module 1625, near field communication (NFC) controller 1630, audio driver 1635, camera driver 1640, touch screen 1645, display driver 1650, sensors 1655, removable memory 1660, power management integrated circuit (PMIC) 1665 and smart battery 1670.

In some aspects, application processor 1605 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1610 may be implemented, for example, as a solder-down substrate including one or more integrated circuits, a single packaged integrated circuit soldered to a main circuit board, and/or a multi-chip module containing two or more integrated circuits.

Figure 17:
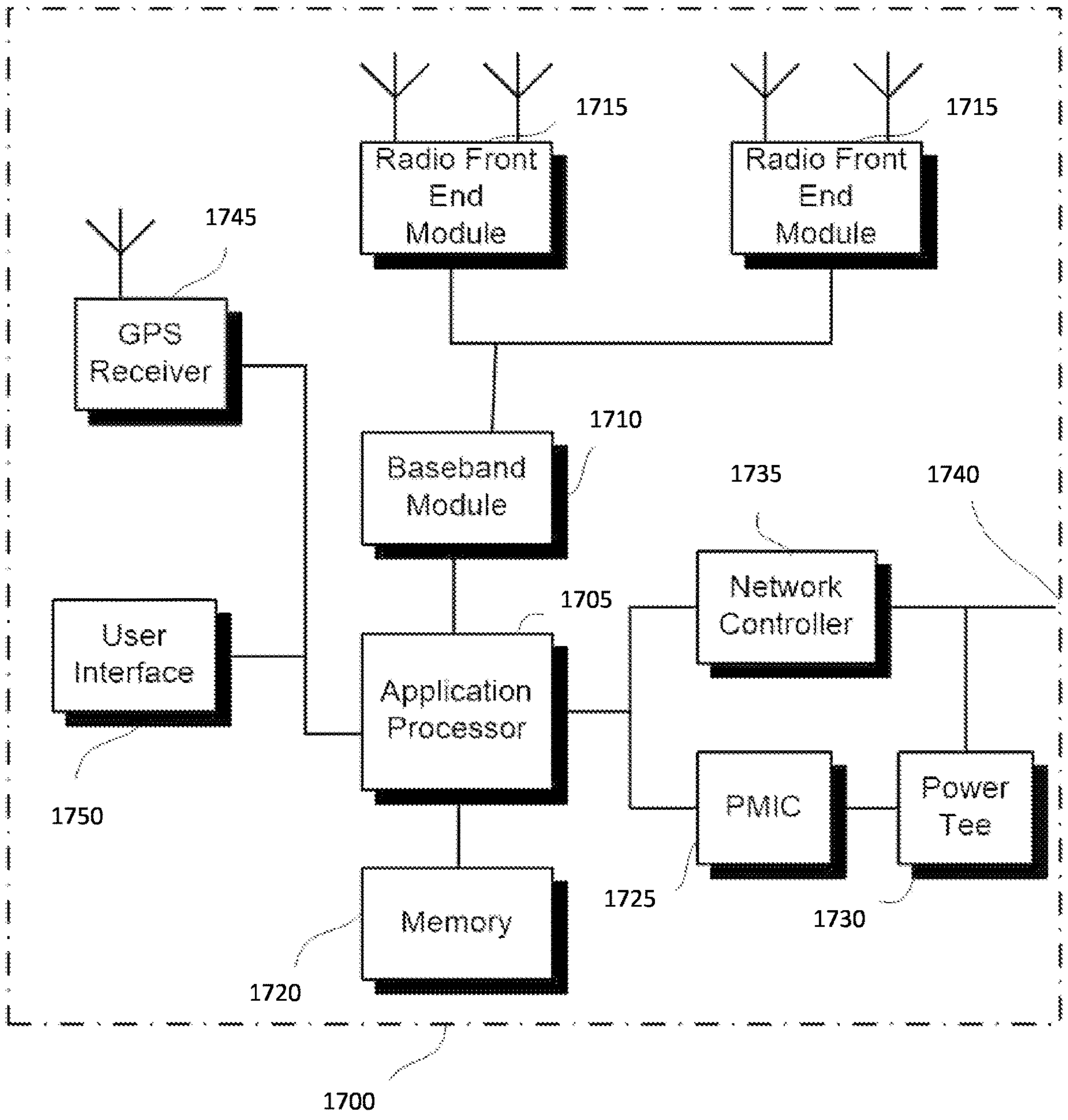
FIG. 17 illustrates a base station or infrastructure equipment radio head in which the examples disclosed herein may be implemented.

FIG. 17 illustrates a base station or infrastructure equipment radio head 1700 in which the examples disclosed herein may be implemented. For example, the examples disclosed herein may be implemented in the radio front-end module 1715, in the baseband module 1710, etc. The base station radio head 1700 may include one or more of application processor 1705, baseband modules 1710, one or more radio front end modules 1715, memory 1720, power management circuitry 1725, power tee circuitry 1730, network controller 1735, network interface connector 1740, satellite navigation receiver module 1745, and user interface 1750.

In some aspects, application processor 1705 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1710 may be implemented, for example, as a solder-down substrate including one or more integrated circuits, a single packaged integrated circuit soldered to a main circuit board or a multi-chip module containing two or more integrated circuits.

In some aspects, memory 1720 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1720 may be implemented as one or more of solder down packaged integrated circuits, socketed memory modules and plug-in memory cards.

In some aspects, power management integrated circuitry 1725 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1730 may provide for electrical power drawn from a network cable to provide both power supply and data connectivity to the base station radio head 1700 using a single cable.

In some aspects, network controller 1735 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1745 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1745 may provide data to application processor 1705 which may include one or more of position data or time data. Application processor 1705 may use time data to synchronize operations with other radio base stations.

In some aspects, user interface 1750 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

An example (e.g., example 1) relates to a multi-device system. The multi-device system includes a plurality of devices, a plurality of clock dividers, and delay circuit. The plurality of devices are configured to operate based on a first clock signal supplied to the plurality of devices. The plurality of clock dividers are configured to generate a second clock signal from the first clock signal and provide the second clock signal to the plurality of devices. The delay circuit is configured to incur a specific delay to the second clock signal provided to the plurality of devices such that a phase of the second clock signal provided to the plurality of devices is spread over time.

Another example, (e.g., example 2) relates to a previously described example (e.g., example 1), wherein each of the plurality of clock dividers is configured to be reset based on a reference clock signal provided to each clock divider, and the delay circuit is configured to incur the specific delay on the reference clock signal provided to each clock divider.

Another example, (e.g., example 3) relates to a previously described example (e.g., example 2), wherein the reference clock signal is delayed by a multiple of a period of the first clock signal.

Another example, (e.g., example 4) relates to a previously described example (e.g., any one of examples 1-3), wherein the phase of the second clock signal provided to the plurality of devices is spread evenly over time.

Another example, (e.g., example 5) relates to a previously described example (e.g., any one of examples 1-4), wherein the phase of the second clock signal provided to a pair of adjacent devices is inverted.

Another example, (e.g., example 6) relates to a previously described example (e.g., any one of examples 1-5), wherein the delay circuit is configured to incur the specific delay on an output signal of each clock divider.

Another example, (e.g., example 7) relates to a previously described example (e.g., example 6), wherein the output signal is delayed by a multiple of a period of the first clock signal.

Another example, (e.g., example 8) relates to a previously described example (e.g., any one of examples 1-7), wherein the delay circuit is a programmable delay circuit.

Another example, (e.g., example 9) relates to a previously described example (e.g., example 8), wherein the delay circuit comprises a chain of multiple pairs of a shift register and a multiplexer coupled in series, wherein each shift register in the chain is configured to operate on the first clock signal, the reference clock signal is coupled to one input of the multiplexer, and an output of the multiplexer is coupled to an input of a subsequent shift register in the chain, and an output of the shift register is coupled to another input of the multiplexer.

Another example, (e.g., example 10) relates to a previously described example (e.g., example 8), wherein the delay circuit comprises a counter and a comparator, wherein the counter is configured to increment by the first clock signal and reset by the second clock signal, and the comparator is configured to compare an output of the counter to a threshold, wherein the second clock signal is output based on an output of the comparator.

Another example, (e.g., example 11) relates to a previously described example (e.g., example 8), wherein the output signal is delayed by a multiple of a period of the first clock signal.

Another example, (e.g., example 12) relates to a previously described example (e.g., any one of examples 1-11), wherein the specific delay depends on configuration of the plurality of devices.

Another example, (e.g., example 13) relates to a previously described example (e.g., any one of examples 1-12), further comprising a calibration circuit configured to change the specific delay incurred by the delay circuit.

Another example, (e.g., example 14) relates to a previously described example (e.g., example 13), wherein the calibration circuit includes a controller configured to set the specific delay based on measurements on outputs of the devices.

Another example, (e.g., example 15) relates to a previously described example (e.g., example 13), wherein the calibration circuit includes a controller configured to set the specific delay based on spectrum analysis on outputs of the devices.

Another example, (e.g., example 16) relates to a previously described example (e.g., any one of examples 1-15), where the devices are transceivers.

Another example, (e.g., example 17) relates to a method for phase alignment of multiple devices in a multi-device system. The method includes providing a first clock signal to a plurality of devices, generating, by a plurality of clock dividers, a second clock signal from the first clock signal, providing the second clock signal to the plurality of devices, and incurring a specific delay to the second clock signal provided to each of the plurality of devices such that a phase of the second clock signal provided to the plurality of devices is spread over time.

Another example, (e.g., example 18) relates to a previously described example (e.g., example 17), further comprising providing a reference clock signal to the plurality of clock dividers, wherein the clock dividers are reset based on the reference clock signal, wherein the specific delay is applied to the reference clock signal provided to each clock divider.

Another example, (e.g., example 19) relates to a previously described example (e.g., example 18), wherein the specific delay is a multiple of a period of the first clock signal.

Another example, (e.g., example 20) relates to a previously described example (e.g., any one of examples 17-19), wherein the phase of the second clock signal provided to the plurality of devices is spread evenly over time.

Another example, (e.g., example 21) relates to a previously described example (e.g., any one of examples 17-20), wherein the specific delay is incurred on an output signal of each clock divider.

Another example, (e.g., example 22) relates to a previously described example (e.g., any one of examples 17-21), wherein the specific delay is adaptively changed.

Another example, (e.g., example 23) relates to a previously described example (e.g., any one of examples 17-22), wherein the specific delay depends on configuration of the plurality of devices.

Another example, (e.g., example 24) relates to a non-transitory machine-readable medium including code, when executed, to cause a machine to perform the method as in any one of examples 17-23.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP)

hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or-steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A multi-device system, comprising:

a plurality of devices, wherein the plurality of devices are configured to operate based on a first clock signal supplied to the plurality of devices;

a plurality of clock dividers configured to generate a plurality of second clock signals from the first clock signal and provide each of the plurality of second clock signals to a corresponding one of the plurality of devices; and delay circuit configured to incur a specific delay to each of the plurality of second clock signals provided to the plurality of devices such that phases of the plurality of second clock signals provided to the plurality of devices are spread over time.

2. The multi-device system of claim 1, wherein each of the plurality of clock dividers is configured to be reset based on a reference clock signal provided to each clock divider, and the delay circuit is configured to incur the specific delay on the reference clock signal provided to each clock divider.

3. The multi-device system of claim 2, wherein the reference clock signal is delayed by a multiple of a period of the first clock signal.

4. The multi-device system of claim 1, wherein the phase of the second clock signal provided to the plurality of devices is spread evenly over time.

5. The multi-device system of claim 1, wherein the phase of the second clock signal provided to a pair of adjacent devices is inverted.

6. The multi-device system of claim 1, wherein the delay circuit is configured to incur the specific delay on an output signal of each clock divider.

7. The multi-device system of claim 6, wherein the output signal is delayed by a multiple of a period of the first clock signal.

8. The multi-device system of claim 1, wherein the delay circuit is a programmable delay circuit.

9. The multi-device system of claim 8, wherein the delay circuit comprises a chain of multiple pairs of a shift register and a multiplexer coupled in series, wherein each shift register in the chain is configured to operate on the first clock signal, the reference clock signal is coupled to one input of the multiplexer, and an output of the multiplexer is coupled to an input of a subsequent shift register in the chain, and an output of the shift register is coupled to another input of the multiplexer.

10. The multi-device system of claim 8, wherein the delay circuit comprises a counter and a comparator, wherein the counter is configured to increment by the first clock signal and reset by the second clock signal, and the comparator is configured to compare an output of the counter to a threshold, wherein the second clock signal is output based on an output of the comparator.

11. The multi-device system of claim 8, wherein the delay circuit is configured to incur the specific delay on an output signal of each clock divider and the output signal is delayed by a multiple of a period of the first clock signal.

12. The multi-device system of claim 1, wherein the specific delay depends on configuration of the plurality of devices.

13. The multi-device system of claim 1, further comprising a calibration circuit configured to change the specific delay incurred by the delay circuit.

14. The multi-device system of claim 13, wherein the calibration circuit includes a controller configured to set the specific delay based on measurements on outputs of the devices.

15. The multi-device system of claim 13, wherein the calibration circuit includes a controller configured to set the specific delay based on spectrum analysis on outputs of the devices.

16. The multi-device system of claim 1, where the devices are transceivers.

17. A method for phase alignment of multiple devices in a multi-device system, comprising:

providing a first clock signal to a plurality of devices;

generating, by a plurality of clock dividers, a plurality of second clock signals from the first clock signal;

providing each of the plurality of second clock signals to a corresponding one of the plurality of devices; and incurring a specific delay to each of the plurality of second clock signals provided to each of the plurality of devices such that phases of the plurality of second clock signals provided to the plurality of devices are spread over time.

18. The method of claim 17, further comprising:

providing a reference clock signal to the plurality of clock dividers, wherein the clock dividers are reset based on the reference clock signal, wherein the specific delay is applied to the reference clock signal provided to each clock divider.

19. The method of claim 18, wherein the specific delay is a multiple of a period of the first clock signal.

20. The method of claim 17, wherein the phase of the second clock signal provided to the plurality of devices is spread evenly over time.

21. The method of claim 17, wherein the specific delay is incurred on an output signal of each clock divider.

22. The method of claim 17, wherein the specific delay is adaptively changed.

23. The method of claim 17, wherein the specific delay depends on configuration of the plurality of devices.

24. A non-transitory machine-readable medium including code, when executed, to cause a machine to perform the method of claim 17.

* * * * *